(12) United States Patent
Shin et al.

(10) Patent No.: US 8,450,844 B2
(45) Date of Patent: May 28, 2013

(54) SEMICONDUCTOR PACKAGE AND METHOD OF MANUFACTURING THE SAME

(75) Inventors: Yee Na Shin, Seoul (KR); Seung Wook Park, Gyunggi-do (KR)

(73) Assignee: Samsung Electro-Mechanics Co., Ltd., Suwon (KR)

( * ) Notice: Subject to any disclaimer, the term of this patent is extended or adjusted under 35 U.S.C. 154(b) by 35 days.

(21) Appl. No.: 12/805,122

(22) Filed: Jul. 13, 2010

(65) Prior Publication Data

US 2011/0163437 A1    Jul. 7, 2011

(30) Foreign Application Priority Data

Jan. 7, 2010    (KR) .................. 10-2010-0001279

(51) Int. Cl.
*H01L 23/48*    (2006.01)

(52) U.S. Cl.
USPC .............. 257/698; 257/E23.011; 438/125

(58) Field of Classification Search
USPC ............ 257/698, 700, 701, 723–726, E23.01, 257/E23.011; 438/125–127
See application file for complete search history.

(56) References Cited

U.S. PATENT DOCUMENTS

| | | | | |
|---|---|---|---|---|
| 2002/0038725 A1* | 4/2002 | Suzuki et al. | .................. | 174/262 |
| 2004/0040855 A1* | 3/2004 | Batinovich | .................... | 205/123 |
| 2007/0069320 A1 | 3/2007 | Lee et al. | | |
| 2008/0029895 A1* | 2/2008 | Hu et al. | ....................... | 257/762 |
| 2009/0154132 A1 | 6/2009 | Okamoto et al. | | |

FOREIGN PATENT DOCUMENTS

| | | |
|---|---|---|
| JP | 10-27767 | 1/1998 |
| JP | 2002-84074 | 3/2002 |
| JP | 2004-335641 | 11/2004 |
| JP | 2006-310532 | 11/2006 |
| KR | 10-0758229 | 9/2007 |
| KR | 10-2007-0101183 A | 10/2007 |
| KR | 10-2008-0056016 | 6/2008 |

OTHER PUBLICATIONS

Korean Office Action issued May 18, 2011 in corresponding Korean Patent Appilcation 10-2010-0001279.
Japanese Office Action issued Jul. 10, 2012 in corresponding Japanese Patent Application No. 2010-154024.
Japanese Office Action issued Dec. 11, 2012 for corresponding Japanese Application No. 2010-154024.

\* cited by examiner

*Primary Examiner* — Julio J Maldonado
*Assistant Examiner* — Daniel Shook

(57) ABSTRACT

There is provided a semiconductor package. A semiconductor package according to an aspect of the invention may include a core part having a semiconductor chip mounted within a receiving space therein; an insulation part provided on one surface of the core part; and a via part provided by filling a hole-processed surface formed simultaneously through the insulation part and a passivation layer for protecting an electrode pattern part on the semiconductor chip.

8 Claims, 3 Drawing Sheets

SEMICONDUCTOR PACKAGE AND METHOD OF MANUFACTURING THE SAME

CROSS-REFERENCE TO RELATED APPLICATIONS

This application claims the priority of Korean Patent Application No. 2010-0001279 filed on Jan. 7, 2010, in the Korean Intellectual Property Office, the disclosure of which is incorporated herein by reference.

BACKGROUND OF THE INVENTION

1. Field of the Invention

The present invention relates to a semiconductor package and a method of manufacturing a semiconductor package, and more particularly, to a semiconductor package and a method of manufacturing the same that can reduce the number of manufacturing processes.

2. Description of the Related Art

One of the most important trends in technical developments in the semiconductor industry is to reduce the size of semiconductor devices.

In order to manufacture small, lightweight and thin components, a technique aimed at reducing the individual sizes of mounting components, a system on chip (SOC) technique aimed at integrating a plurality of individual devices into a single chip, and a system in package (SIP) technique aimed at integrating a plurality of individual devices into a single package are required. Rerouting or redistribution may be used in order to realize these techniques.

Therefore, this semiconductor package can reduce the amount of wiring used to interconnect electronic components and thereby realize high density wiring. Furthermore, by mounting electronic components, this semiconductor package increases the surface area of a circuit board and has excellent electrical characteristics.

In particular, as for an embedded circuit board, semiconductor chips are embedded in a circuit board rather than being mounted on the surface thereof, thereby realizing high density, high performance and size reduction in the circuit board. Thus, there is an increasing demand for embedded circuit boards.

However, this semiconductor package requires a plurality of wiring processes to be performed on the semiconductor chips in order that those semiconductor chips are connected to the circuit board, which takes a great deal of time and increases costs in manufacturing the semiconductor package. Thus, there has been a need for a reduction in the number of processes to thereby realize economic efficiency. Therefore, techniques to solve these problems have been required.

SUMMARY OF THE INVENTION

An aspect of the present invention provides a semiconductor package and a method of manufacturing the same that can reducing the number of manufacturing processes and time required therefor by omitting a process of forming a bump layer and forming the same hole-processed surface on a passivation layer and an insulation part.

According to an aspect of the present invention, there is provided a semiconductor package including: a core part having a semiconductor chip mounted within a receiving space therein; an insulation part provided on one surface of the core part; and a via part provided by filling a hole-processed surface formed simultaneously through the insulation part and a passivation layer for protecting an electrode pattern part on the semiconductor chip.

The hole-processed surface may be tapered inwards.

The electrode pattern part may have a thickness of 5 to 15 μm.

The semiconductor chip may include an insulating layer provided between a board and the electrode pattern part.

According to another aspect of the present invention, there is provided a method of manufacturing a semiconductor package, the method including: forming an insulating layer on a board; forming an electrode pattern part on the insulating layer by rerouting plating in order to establish a circuit connection; forming a passivation layer to completely cover the electrode pattern part to thereby manufacture a semiconductor chip; mounting the semiconductor chip on a circuit board having a receiving space therein and forming an insulation part to cover the semiconductor chip; and forming a via part being a hole-processed surface simultaneously through both the passivation layer and the insulation part, and then filling the via part.

The hole-processed surface may be formed by laser processing.

The electrode pattern part may have a thickness of approximately 5 to 15 μm.

The forming of the electrode pattern part may include forming a copper (Cu) layer on the insulating layer by sputtering.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Figure 1:
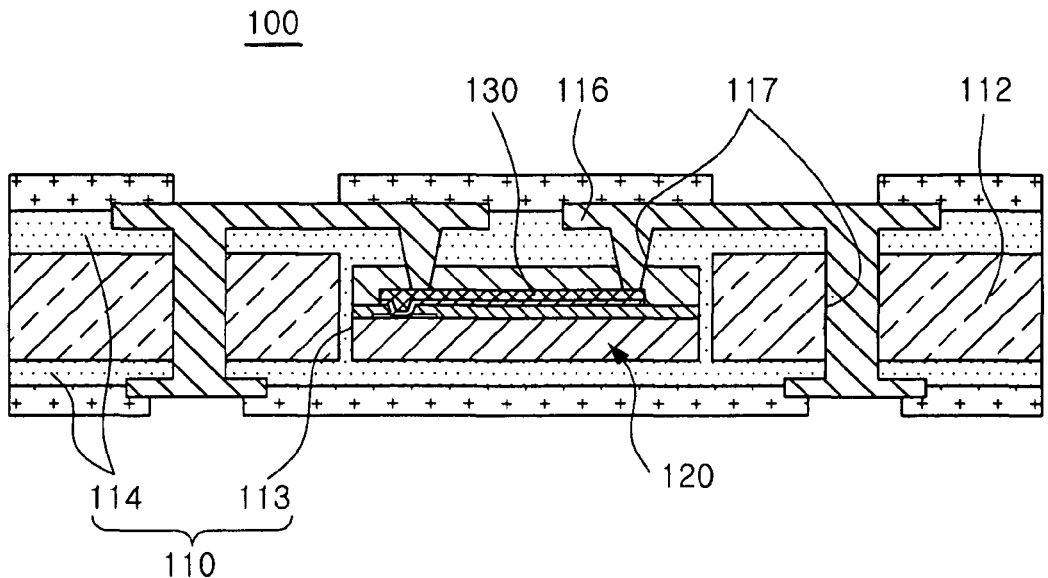
FIG. 1 is a cross-sectional view illustrating a semiconductor package according to an exemplary embodiment of the present invention.

A semiconductor package and a method of manufacturing the same will be described in more detail with reference to FIGS. 1 through 9. Exemplary embodiments of the present invention will now be described in detail with reference to the accompanying drawings.

The invention may, however, be embodied in many different forms and should not be construed as being limited to the embodiments set forth herein. While those skilled in the art could readily devise many other varied embodiments that incorporate the teachings of the present invention through the addition, modification or deletion of elements, such embodiments may fall within the scope of the present invention.

In the drawings, the same or like reference numerals will be used throughout to designate the same or like components.

FIG. 1 is a cross-sectional view illustrating a semiconductor package according to an exemplary embodiment of the invention.

Referring to FIG. 1, a semiconductor package 100 may include a circuit board 110 having a core part 112 and an insulation part 114, and a semiconductor chip 120.

The circuit board 110 may form one or more recesses 113 in the core part 112 in order to provide a receiving space in which the semiconductor chip 120 is mounted. Here, recesses may be formed by dry etching, wet etching, laser drilling or punching.

After the semiconductor chip 120 is mounted in the mounting space, the insulation part 114 having a predetermined thickness is formed thereon. Through this process, the semiconductor chip 120, which is received in the circuit board 110, is thereby sealed.

Via parts 116 may be formed in the surface of the circuit board 110 so that the circuit board 110 is electrically connected to an electrode pattern part 130 that is formed on the surface of the semiconductor chip 120.

The via parts 116 may be formed in such a manner that via holes 117 are formed to expose the electrode pattern part 130 and are then filled with a conductive material. Further, the via parts 116 may be electrically connected to a circuit pattern that is formed on the surface of the circuit board 110.

Here, the via hole 117 is formed by a known method. A laser drilling method using carbon dioxide may be performed.

The semiconductor chip 120 may be inserted into the receiving space of the circuit board 110 and be electrically connected to the via parts 116. Here, the semiconductor chip 120 may comprise a plurality of semiconductor chips 120 that are provided on a substrate wafer. These semiconductor chips may be active devices, passive devices or IC chips.

Here, the electrode pattern part 130 may be formed on the semiconductor chip 120 by rerouting plating. The electrode pattern part 130 is electrically connected to the via parts 116 so that the electrode pattern part 130 is electrically connected to the circuit board 110.

When the electrode pattern part 130 is formed on one surface of the semiconductor chip 120, the electrode pattern part 130 may be formed into a pattern shape by rerouting plating. Here, the pattern shape may refer to a shape such as circuit wires formed so as to provide electrical connection.

Here, the electrode pattern part 130 may have a thickness of approximately 5 to 15 μm. Therefore, the electrode pattern part 130 having this thickness may result in a reduction in the electrical resistance of the semiconductor chip 120. Electrical reliability can be increased by the electrode pattern part 130.

Furthermore, in general, when the semiconductor chip 120 is electrically connected to the circuit board 110, a separate bump layer is formed on the semiconductor chip 120. On the other hand, in order to connect the electrode pattern part 130 directly to the via parts 116, the electrode pattern part 130 having the above-described thickness is not formed so that the semiconductor chip 120 is exposed when the via holes 117 are formed. As a result, electrical disconnection can be prevented.

Therefore, the semiconductor package according to this embodiment allows omission a process of manufacturing this bump layer, thereby reducing the number of manufacturing processes and manufacturing time required therefor to thereby obtain significant economic efficiency. Furthermore, the reduction in the number of processes improves the manufacturing yield of the semiconductor package.

Here, as for the via part 116, a hole is formed by laser processing. A hole-processed surface is formed simultaneously through both the insulation part 114 and the passivation layer 140 of the semiconductor chip 120. Here, since it may be impossible to bore a hole through the electrode pattern part 130 having the thickness of approximately 5 to 15 μm by laser processing, the hole-processed surface can be formed simultaneously through both the insulation part 114 and the passivation layer 140.

Therefore, in this embodiment, there is no need to process the passivation layer 140 of the semiconductor chip 120 to form a hole therethrough for providing electrical connection, thereby reducing the number of manufacturing processes and thus obtain further economic efficiency.

FIGS. 2 through 6 are cross-sectional views illustrating a semiconductor chip of a semiconductor package according to an exemplary embodiment of the invention.

Figure 2:
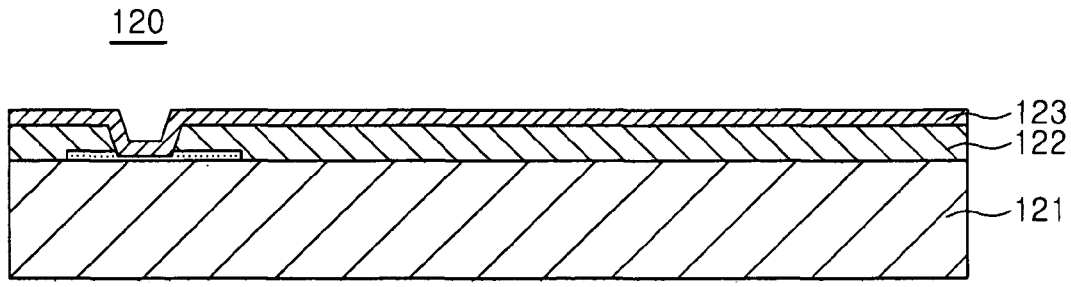
FIGS. 2 through 6 are cross-sectional views illustrating a semiconductor chip of a semiconductor package according to an exemplary embodiment of the present invention.

Referring to FIG. 2, as for the semiconductor chip 120, an insulating layer 122 may be formed on a board 121 formed of an insulating material.

Here, the insulating layer 122 may be formed to have an opening such that a pad, formed on the board 121, is exposed through the opening to the outside. The insulating layer 122 may be formed of a photosensitive material. The insulating layer 122 may include at least one selected from the group consisting of polyimide, polybenzoxazole, benzocyclobutene, and epoxy. However, the material of the insulating layer 122 is not limited thereto.

Further, as shown in FIG. 2, a plating layer 123, formed of copper (Cu), may be formed by sputtering on one surface of the semiconductor chip 120 on which the insulating layer 122 is formed.

Therefore, the plating layer 123 may be formed on the entire front surface of the semiconductor chip 120, including the opening of the insulating layer 122.

Figure 3:
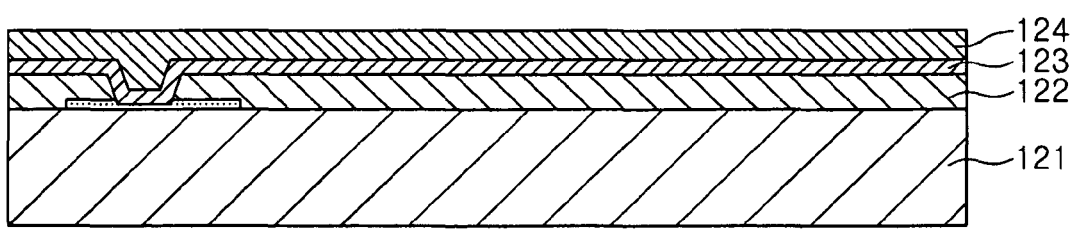
Figure 4:
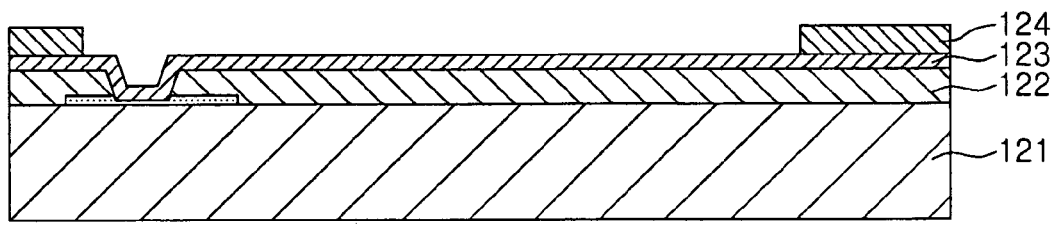

Then, as shown in FIGS. 3 and 4, after a photoresist layer 124 is formed on one surface of the semiconductor chip 120, a portion of the photoresist layer 124, at which the electrode pattern part 130 will be formed, is removed using a mask.

Figure 5:
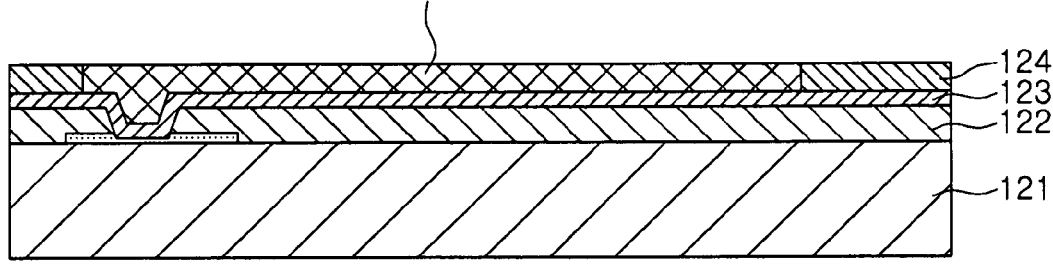

Then, as shown in FIG. 5, the electrode pattern part 130 is formed in the photoresist layer 124 by using an electroplating method. In general, the electrode pattern part 130 may be formed by electroplating or sputtering.

Here, the electrode pattern part 130 may have a thickness of approximately 5 to 15 μm. Therefore, the electrode pattern part 130 can reduce the electrical resistance of the semiconductor chip 120. Furthermore, electrical resistance is increased by the electrode pattern part 130 having the above-described thickness.

Figure 6:
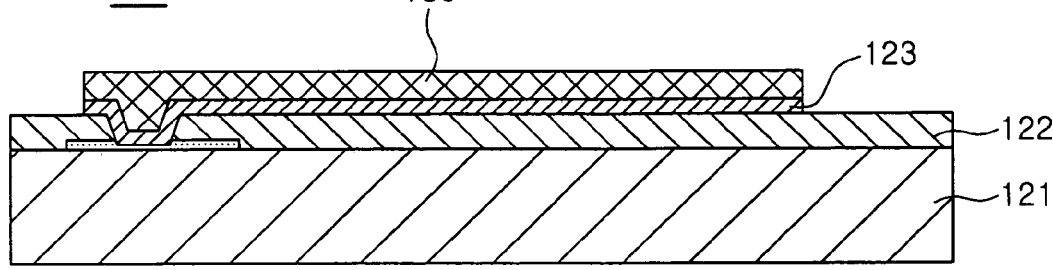

Then, as shown in FIG. 6, the photoresist layer 124 on which the electrode pattern part 130 is not formed is removed. Here, the photoresist layer 124 is removed by an etching process or a strip process.

The passivation layer 140 is subsequently formed on the electrode pattern part 130 and the insulating layer 122 in order to protect the electrode pattern part 130. Here, the passivation layer 140 may be one of a silicon nitride layer, a silicon oxide layer, and a silicon oxynitride layer, or a multilayer thereof. Therefore, the electrode pattern part 130 and other circuit patterns may be protected by the passivation layer 140.

Figure 7:
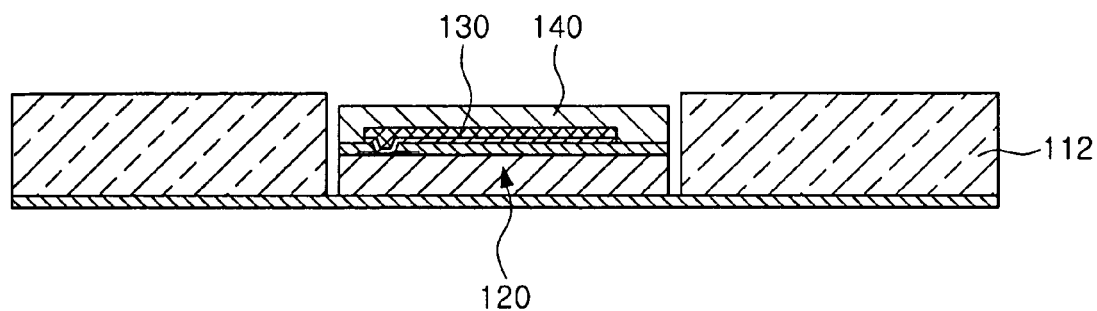
FIGS. 7 through 9 are cross-sectional views illustrating a method of manufacturing a semiconductor package according to an exemplary embodiment of the present invention.
Figure 8:
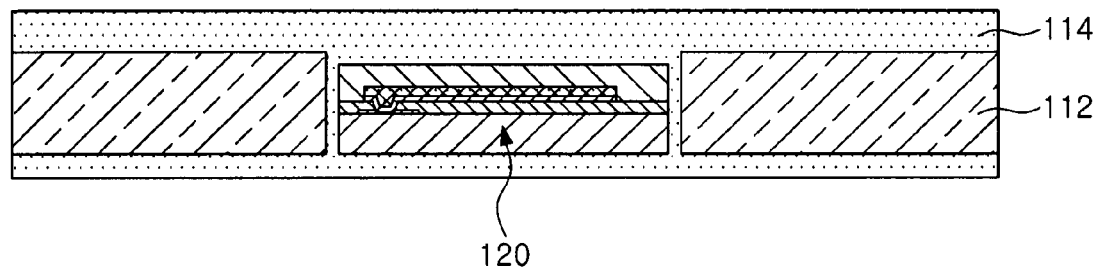
Figure 9:
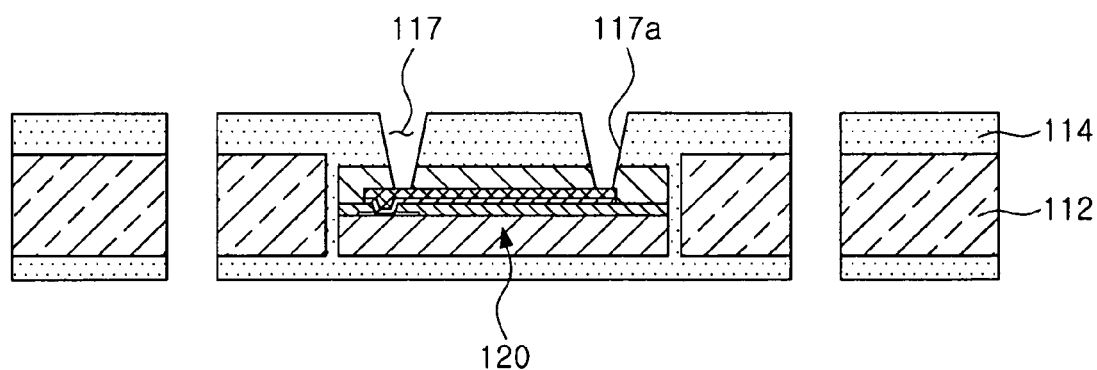

FIGS. 7 through 9 are cross-sectional views illustrating a method of manufacturing a semiconductor package according to an exemplary embodiment of the invention.

Referring to FIGS. 7 through 9, according to a method of manufacturing a semiconductor package, the semiconductor chip 120, manufactured as shown in FIGS. 2 through 6, is mounted within the receiving space of the core part 112, and the insulation parts 114 are formed on the core part 112. Therefore, the semiconductor chip 120 is embedded within the circuit board.

In order to electrically connect the semiconductor chip 120, the via holes 117 are formed by laser processing.

Here, the same processed surface 117a is formed on the insulation part 114 and the passivation layer 140 of the semiconductor chip 120.

Here, the processed surface 117*a* is tapered since the hole decreases in diameter from the outside to the inside.

The semiconductor chip 120 having the above-described configuration is mounted in the circuit board 110 having the receiving space, thereby completing a semiconductor package. The semiconductor package manufactured as described above is subjected to a process of thinning a wafer and a dicing process to thereby manufacture a product.

As a result, in this embodiment, there is no need to process a the passivation layer 140 of the semiconductor chip 120 to form a hole therethrough in order to provide electrical connection, thereby reducing the number of manufacturing processes and thus obtaining further economic efficiency.

Furthermore, since the semiconductor package according to this embodiment does not require a separate bump layer on the semiconductor chip 120, a process of forming a copper-plating layer to form a bump layer, a process of preparing a photoresist layer to form a bump layer, a process of forming a pattern on the photoresist layer, a bump plating process, and a process of removing the photoresist layer and the copper-plating layer can be omitted.

Therefore, the semiconductor package according to this embodiment can be manufactured by a simplified manufacturing method, thereby obtaining economic efficiency. Furthermore, a reduction in the number of manufacturing processes increases the manufacturing yield of the semiconductor package.

As set forth above, according to exemplary embodiments of the invention, a semiconductor package and a method of manufacturing the same includes a via part having a hole-processed surface formed simultaneously through both an insulating part and a passivation layer of a semiconductor chip to thereby form a hole by a one-time process, thereby reducing the number of manufacturing processes.

Furthermore, an electrode pattern part is formed into a pattern shape on one surface of the semiconductor chip and comes into direct contact with a via part of the circuit board to form an electrical connection between the circuit board and the semiconductor chip, thereby removing a process of forming a separate bump. Accordingly, the number of manufacturing processes and time required therefor can be reduced.

While the present invention has been shown and described in connection with the exemplary embodiments, it will be apparent to those skilled in the art that modifications and variations can be made without departing from the spirit and scope of the invention as defined by the appended claims.

What is claimed is:

1. A semiconductor package comprising:
    a semiconductor chip comprising a board, a pad formed on the board, an insulating layer formed on the board and having an opening through which the pad is exposed to the outside, an electrode pattern formed on the insulating layer and a passivation layer formed on the electrode pattern;
    a core part having the semiconductor chip mounted within a receiving space formed therein;
    an insulation part provided on one surface of the core part; and
    a via part provided by filling a hole-processed surface formed simultaneously through the insulation part and the passivation layer for protecting the electrode pattern part formed to have a pattern shape on the semiconductor chip,
    the via part electrically connected to the electrode pattern part, and
    the hole-processed surface offset from the pad.

2. The semiconductor package of claim 1, wherein the hole-processed surface is tapered inwards.

3. The semiconductor package of claim 1, wherein the electrode pattern part has a thickness of 5 to 15 μm.

4. The semiconductor package of claim 1, wherein the semiconductor chip comprises an insulating layer provided between a board and the electrode pattern part.

5. A method of manufacturing a semiconductor package, the method comprising:
    forming a pad on a board;
    forming an insulating layer on the board to have an opening through which the pad is exposed to the outside;
    forming an electrode pattern part to have a pattern shape on the insulating layer by rerouting plating in order to establish a circuit connection;
    forming a passivation layer to completely cover the electrode pattern part to thereby manufacture a semiconductor chip;
    mounting the semiconductor chip on a circuit board having a receiving space therein and forming an insulation part to cover the semiconductor chip; and
    forming a via part being a hole-processed surface simultaneously through both the passivation layer and the insulation part, and then filling the via part, the hole processed surface offset from the pad.

6. The method of claim 5, wherein the hole-processed surface is formed by laser processing.

7. The method of claim 5, wherein the electrode pattern part has a thickness of approximately 5 to 15 μm.

8. The method of claim 5, wherein the forming of the electrode pattern part comprises forming a copper (Cu) layer on the insulating layer by sputtering.

* * * * *